United States Patent
O'Brien (10) Patent No.: US 6,934,595 B1
(45) Date of Patent: Aug. 23, 2005

(54) METHOD AND SYSTEM FOR REDUCING SEMICONDUCTOR WAFER BREAKAGE

(75) Inventor: Allan Daniel O'Brien, South Portland, ME (US)

(73) Assignee: National Semiconductor Corp., Santa Clara, CA (US)

( * ) Notice: Subject to any disclaimer, the term of this patent is extended or adjusted under 35 U.S.C. 154(b) by 215 days.

(21) Appl. No.: 10/375,318

(22) Filed: Feb. 26, 2003

(51) Int. Cl.⁷ ............................................. G06F 19/00
(52) U.S. Cl. ..................... 700/108; 700/109; 700/110; 700/114; 700/121; 451/287; 451/288; 451/289; 451/9
(58) Field of Search ................................ 700/108, 109, 700/110, 112, 113, 114, 121; 451/8, 9, 10, 41, 287, 288, 289

(56) References Cited

U.S. PATENT DOCUMENTS

| | | | | |
|---|---|---|---|---|
| 4,513,430 A | * | 4/1985 | Vora et al. | 377/39 |
| 5,019,233 A | * | 5/1991 | Blake et al. | 204/298.25 |
| 5,077,511 A | * | 12/1991 | George | 204/298.25 |
| 5,484,011 A | * | 1/1996 | Tepman et al. | 165/80.2 |
| 5,822,172 A | * | 10/1998 | White | 361/234 |
| 6,126,517 A | * | 10/2000 | Tolles et al. | 451/41 |
| 6,146,248 A | * | 11/2000 | Jairath et al. | 451/41 |
| 6,211,945 B1 | * | 4/2001 | Baxter et al. | 355/53 |
| 2002/0027433 A1 | * | 3/2002 | Dunklee | 324/158.1 |

* cited by examiner

Primary Examiner—Leo Picard
Assistant Examiner—Charles R. Kasenge
(74) Attorney, Agent, or Firm—Jurgen Vollrath (57) ABSTRACT

In a system and method to reduce wafer breakages in a wafer handling system, the position of a wafer on a platen is monitored and closing of the platen on a vacuum chamber is prevented if a misaligned wafer is detected. In one embodiment the wafer position is monitored by monitoring the air pressure in vacuum channels of a platen faceplate.

12 Claims, 7 Drawing Sheets

METHOD AND SYSTEM FOR REDUCING SEMICONDUCTOR WAFER BREAKAGE

BACK OF THE INVENTION

In the semiconductor industry, semiconductor chips are created by depositing layers on a semiconductor substrate, etching material, and growing and implanting certain regions. The circuits created in this way are formed on a semiconductor wafer which is moved to various workstations using wafer handling equipment. One common step in the fabrication process is the implanting of ions into the wafer using an ion implanter such as the Varian 350D Ion Implanter.

Figure 1:
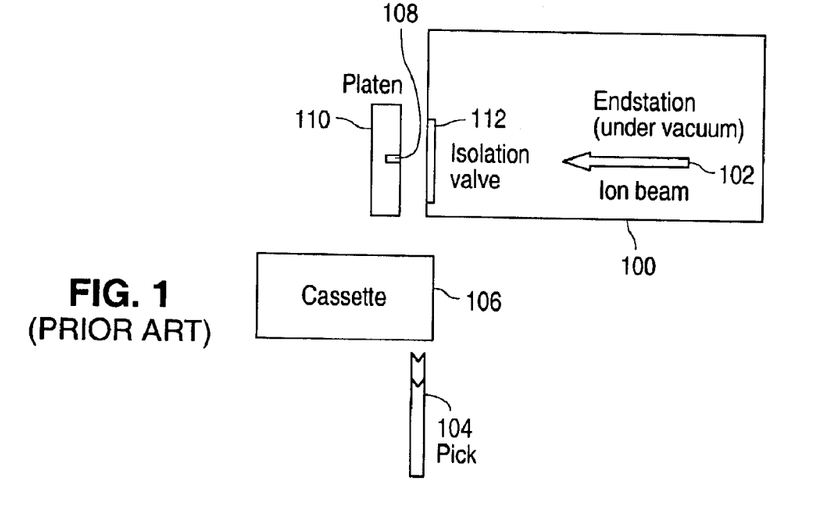
FIGS. 1 to 7, and 9 to 13 show the steps in processing a wafer in a prior art ion implantation using the Varian 350D.

The Varian 350D, as illustrated in FIG. 1, includes a vacuum chamber 100 which constitutes the end station where the ions are implanted using an ion beam 102. It also includes a wafer handling device in the form of a pick 104, which sequentially moves wafers from a cassette 106 to a chuck 108 on a platen 110 for processing in the vacuum chamber 100.

In practice the steps involved in processing the wafer are shown in FIGS. 1–12. FIG. 1 shows the pick 104 in a home position before it picks up a wafer from the cassette 106. The chuck 108 is retracted into the housing of the platen, and the vacuum chamber 100 is closed by means of an isolation valve 112. It will be appreciated that although the ion beam 102 is shown for purposes of reference, no beam would typically be emitted at this stage since the vacuum chamber 100 is not processing any wafers at this stage. The beam is gated off electrostatically while wafer handling is in progress.

Figure 2:
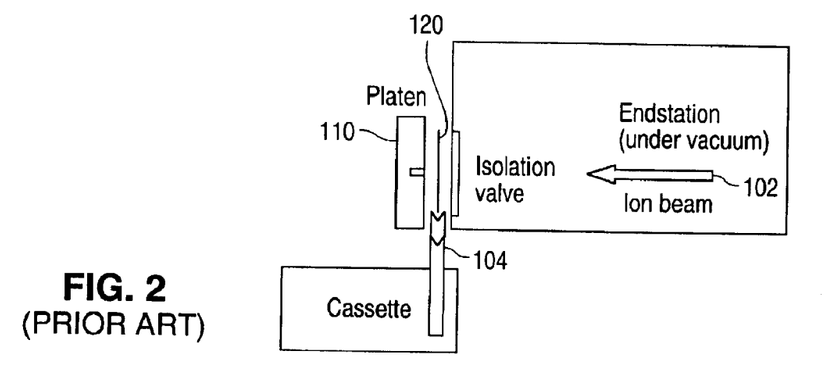

In FIG. 2 the pick 104 picks up a wafer 120 and moves it to infront of the platen. Again, the ion beam is shown merely for reference purposes but is typically not present at this stage.

Figure 3:
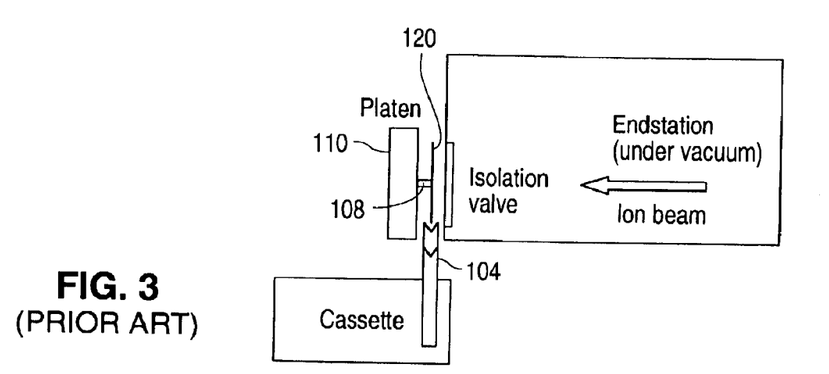
Figure 4:
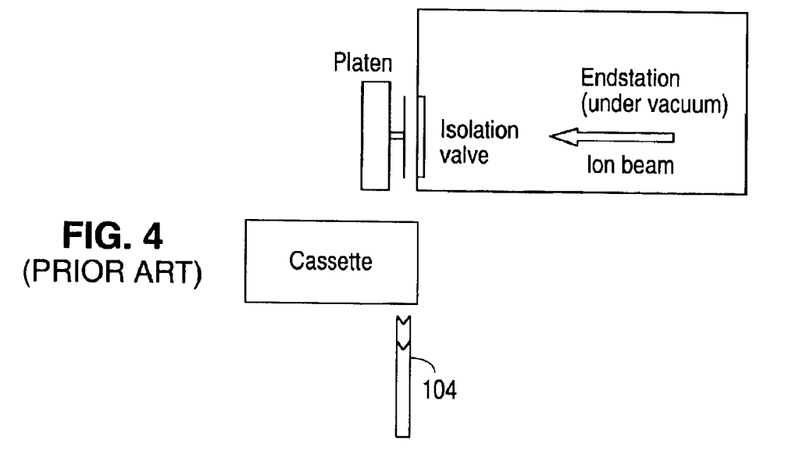
Figures 5, 6:
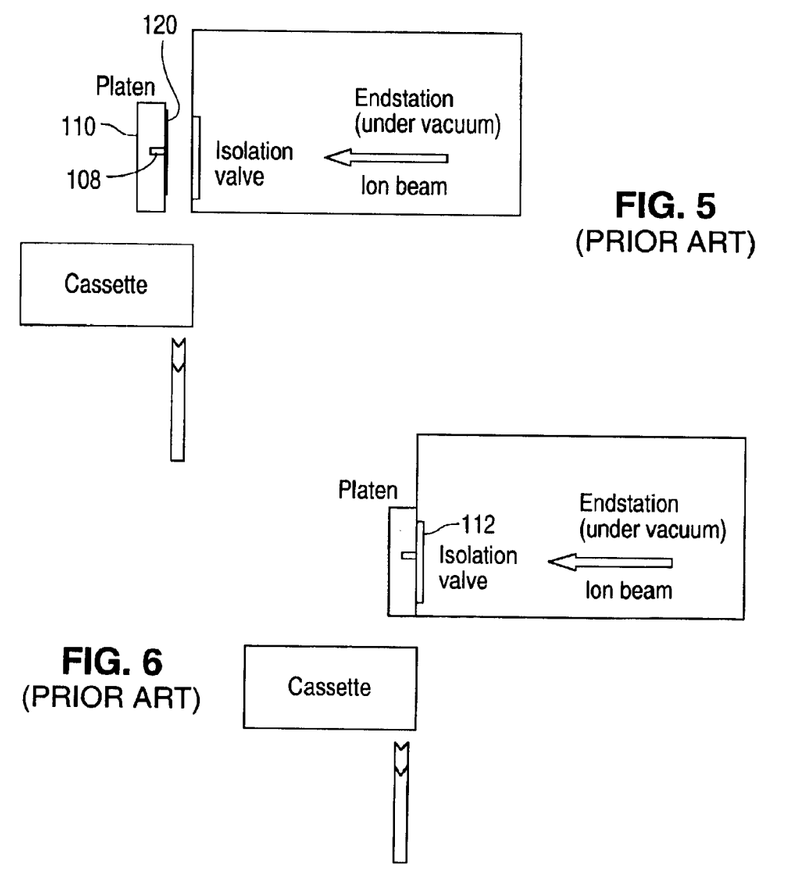

In FIG. 3 the chuck 108 extends from the housing of the platen 110 and holds the wafer 120 by establishing a chuck vacuum between the chuck and the wafer, as will be discussed in greater detail below. FIG. 4 shows the pick 104 retracted to its home position. In FIG. 5 the chuck rotates to the appropriate angle depending on the particular process being used, and then retracts into the housing of the platen 110, holding the wafer 120 against a faceplate by virtue of the chuck vacuum as will be discussed in more detail below.

In FIG. 6, the platen closes against the opening of the vacuum chamber. Since the vacuum chamber is at a reduced pressure, vent channels are provided on the surface of the platen to allow air pockets between the platen surface and the wafer to be eliminated. This will be discussed in greater detail below. Also, to avoid pressure differences on the two sides of the wafer once the isolation valve 112 over the chamber opening is opened, the chuck vacuum is switched off at this stage.

Figure 7:
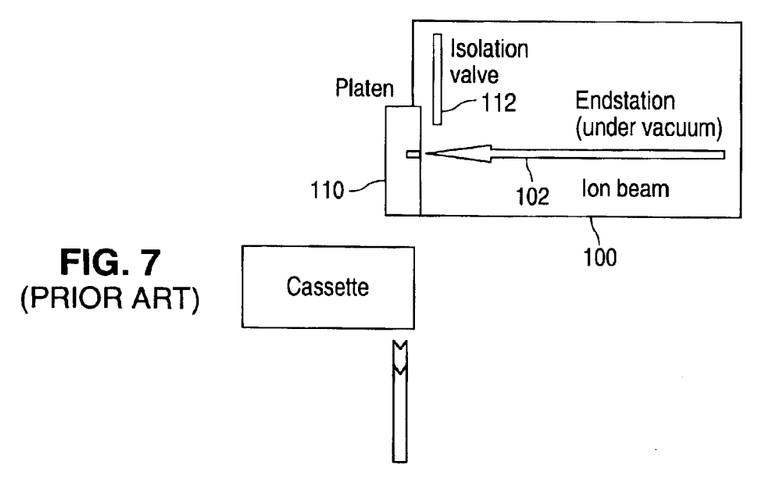
Figure 8:
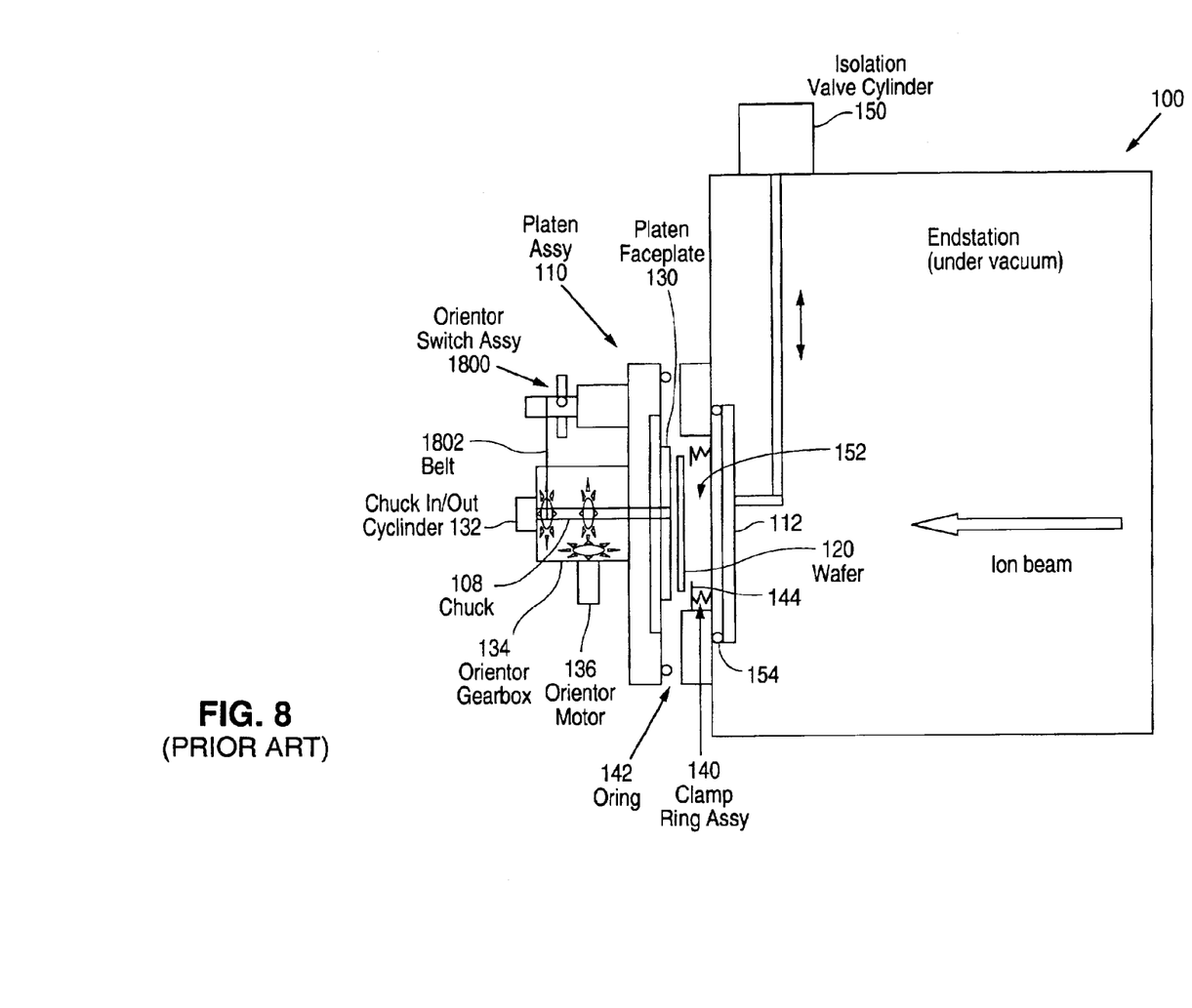
FIG. 8 shows a more detailed depiction of a typical platen assembly and vacuum chamber.
Figure 9:
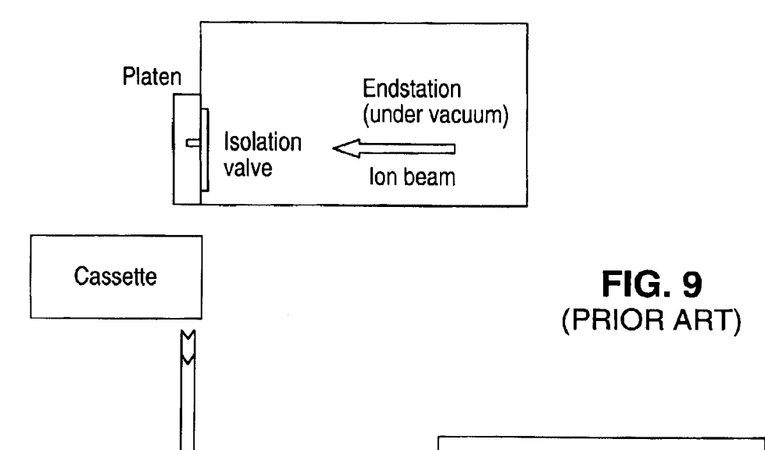

In FIG. 7 the isolation valve 112 is opened and the platen 110 moves into abutment with the opening of the vacuum chamber 100. The platen assembly and vacuum chamber are shown in greater detail in FIG. 8 which shows the platen 110 moving into abutment with the vacuum chamber 100. The platen includes a face plate 130 on which the wafer 120 is held. As can be seen in FIG. 8, the chuck 108 is retracted or extended by means of a chuck cylinder 132 housed in a gearbox housing 134. By withdrawing the cylinder 132, the chuck can be withdrawn to retract the wafer 120 against the platen faceplate 130, as was discussed with respect to FIG. 5 above. As is shown in FIG. 8, the faceplate 130 has a two-tier configuration. FIG. 8 also shows an orientor motor 136 that turns gears in the gearbox housing 134, to orient the wafer to a home position, as was also mentioned with respect to FIG. 5. As can be seen from FIG. 8, the platen 110 moves against a clamp ring assembly 140. An O-ring 142 mounted on the platen 110 sealingly engages a housing of the clamp ring assembly 140, while the faceplate 130 with the wafer 120 mounted thereon moves into an opening of the assembly 140. It will be appreciated that, at this point, the wafer 120 will be held between the faceplate 120 and a clamp ring 144 of the clamp ring assembly 140. As will be discussed further below, the chuck vacuum will be disengaged at this point. FIG. 8 also shows an isolation valve cylinder 150, which serves to move the isolation valve 112 away from the chamber opening 152. The isolation valve 112 seals against an O-ring 154 when closed. Once the implantation is complete, the isolation valve 112 closes and the chuck vacuum is reapplied, as shown in FIG. 9.

Figure 10:
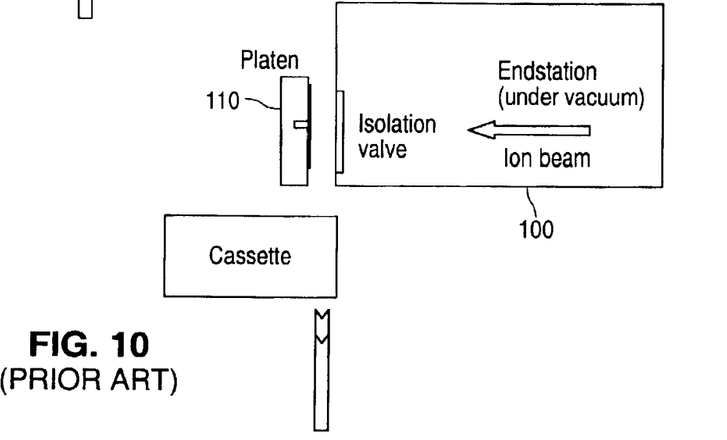

In FIG. 10 the platen 110 opens by moving away from the chamber 100.

Figure 11:
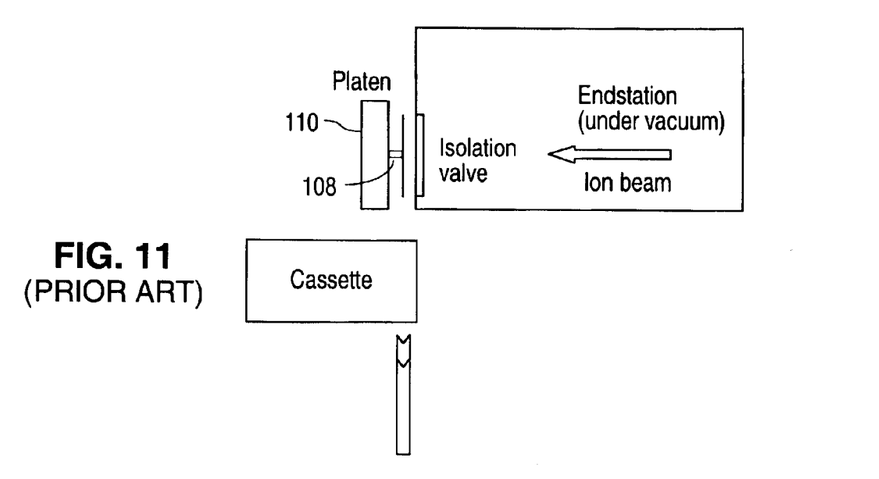
Figure 12:
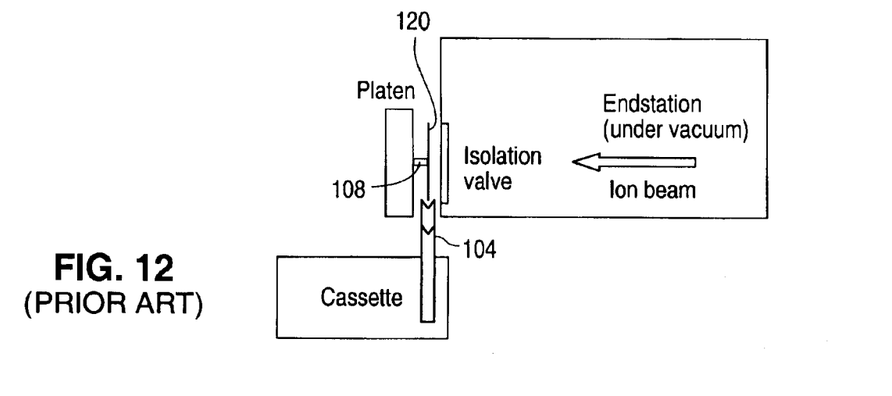

Thereafter, the wafer 120 is removed from the platen as shown in FIGS. 11 to 12. In FIG. 10 the chuck 108 extends and rotates a home position.

In FIG. 12 the pick 104 moves up to receive the wafer 120, at which stage the chuck vacuum is switched off.

Figure 13:
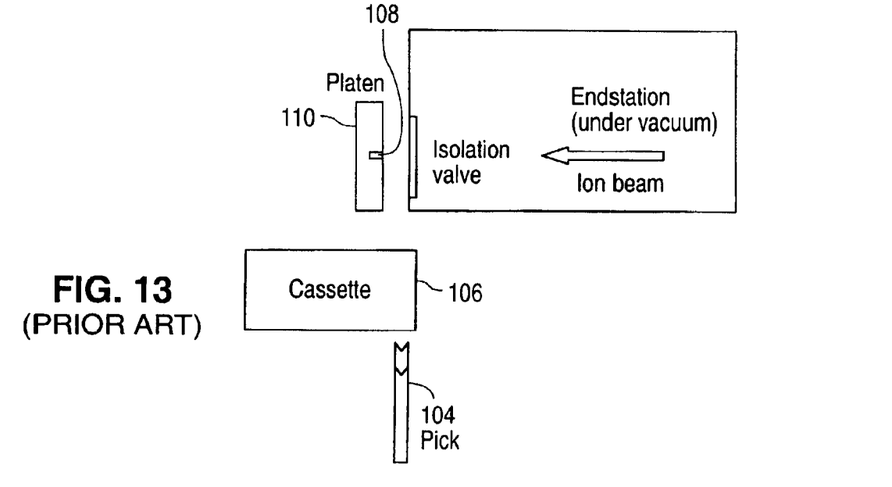

In FIG. 13 the chuck 108 retracts and the pick 104 moves down with the wafer 120 and deposits it in the cassette 106.

Figure 14:
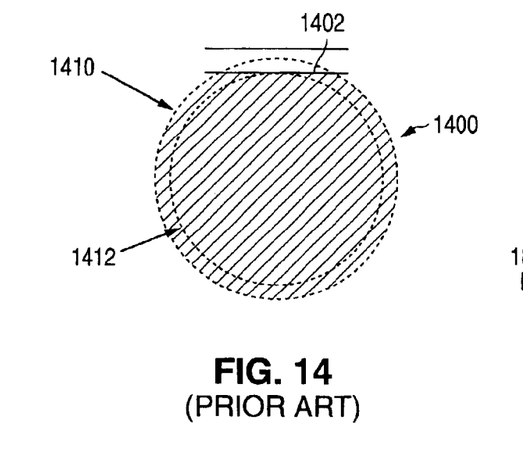
FIG. 14 is a plan view of a typical 150 mm wafer.

In order to understand the problems commonly experienced with the Varian 350D it is useful to consider a typical wafer handled by the Varian and the details of the platen. FIG. 14 shows a typical wafer 1400. In this embodiment, the wafer 1400 has an edge diameter 1410 of 150 mm. The flat surface 1402, which serves to correctly orientate the angle of the wafer during handling and processing, defines a wafer flat diameter 1412 in this case.

Figure 15:
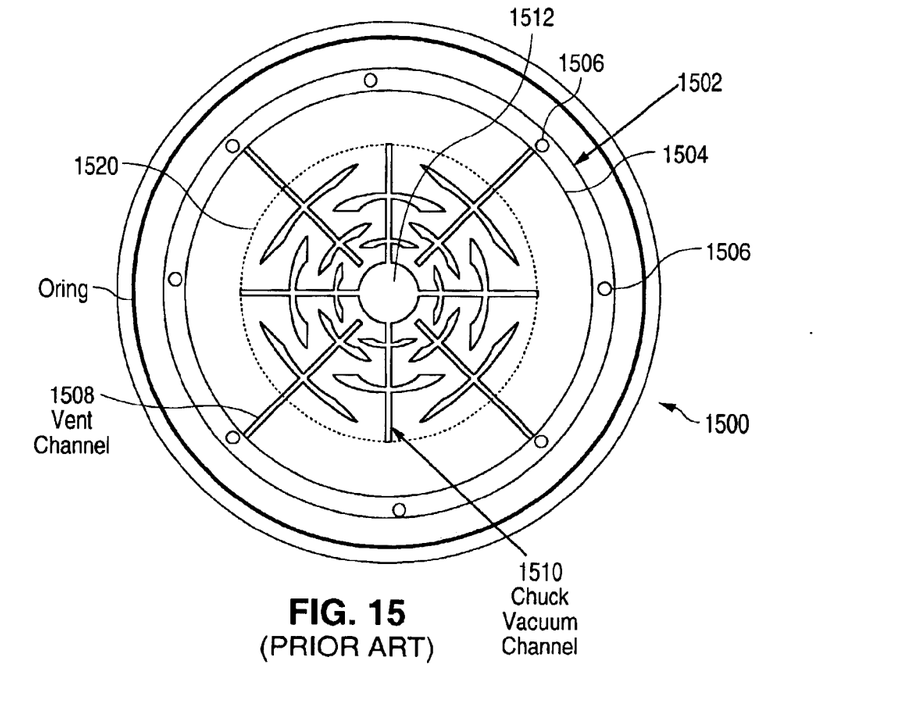
FIG. 15 is a front view of a Varian 350 D platen as known in the art.

FIG. 15 shows a platen 1500 with its two-tiered faceplate 1502of the Varian 350D, on which the wafer (not shown) is held. The smaller tier 1504 of the faceplate 1502, in this embodiment, has a diameter of 152 mm. It is connected to the larger tier, which, in turn, is secured to the platen 1500 by means of bolts (not shown) that extend through peripheral holes 1506 in the larger tier of the faceplate 1502. The wafer used with this embodiment will have a diameter of 150 mm. Thus, the vent channels 1508 will extend beyond the wafer diameter to allow air pockets between the wafer and the smaller tier 1504 of the faceplate 1502 to be eliminated when the platen moves into abutment with the vacuum chamber as discussed above A second set of channels in the form of chuck vacuum channels 1510 extend from the chuck opening 1512 to a diameter of 100 mm as indicated by dotted line 1520. By eliminating air from the chuck opening 1512 and chuck vacuum channels 1510, to create a vacuum, the wafer (not shown) is sucked onto the faceplate 1502 of the platen 1500.

Problems, however, arise when a wafer is misaligned on the platen faceplate 1502. When this happens, the wafer may hit the side of the chamber opening 152 (see FIG. 8) when the platen closes in the step shown in FIG. 6. This may cause the wafer to break causing product wastage and significant downtime required for cleaning debris from the equipment.

The present invention seeks to address this problem for wafer processing equipment having platens similar to that described above.

SUMMARY OF THE INVENTION

The invention relates to a system and method of avoiding wafer breakages due to misalignment on a platen such as the Varian 350D.

According to the invention, the method includes retrofitting the platen of a wafer handling device to allow wafer misalignments that are large enough to cause wafer breakages when the platen closes on a vacuum chamber, to be detected, and providing an interlock circuit to stop the platen from closing in the event that such wafer misalignment is detected. The retrofitting includes providing a platen face that includes chuck vacuum channels that extend from a chuck orifice outwardly to a diameter that is only a little bit smaller than the diameter of the wafer being handled. The diameter to which the channels extend may be 2 to 4 mm less than the wafer diameter. The retrofitting typically includes monitoring the chuck vacuum to detect drops in the vacuum. The interlock circuit may be connected to a platen close signal to interrupt the close signal when a wafer misalignment is detected. The interlock circuit may include an override of the interrupt when the platen orientor is in the home position. The circuit may include an opto-isolator to switch on a transistor of the opto-isolator to permit the close signal to be transmitted. The opto-isolator may include two light emitting diodes, one being activated when no chuck vacuum drop is detected, and one being activated when the platen orientor is in its home position.

Further, according to the invention, there is provided a method of retrofitting a platen having chuck vacuum channels for holding a wafer, comprising extending the vacuum channels outwardly to have an outer diameter that is substantially the same as that of a wafer to be held. The outer diameter of the channels may be slightly smaller, e.g., 2 to 4 mm smaller than the diameter of the wafer. The method may also include monitoring the air pressure in the channels and issuing a signal if a reduced pressure is detected. The signal may be used to stop the platen from closing. The method may also include monitoring the position of the platen orientor and overriding the signal when the platen orientor is in the home position.

Still further according to the invention there is provided a wafer handling system for reducing wafer damage by ensuring that a platen of the system does not close unless the wafer is correctly aligned, the system comprising a platen in which the wafer is held by means of vacuum channels that extend almost to the periphery of the wafer. The system further includes means for monitoring the air pressure in the channel and generating a stop signal if the air pressure is below a define value. The system typically includes an interlock circuit for preventing closing of the platen if a stop signal is generated. The system may include an override to allow the platen to close when a platen orientor is in a home position.

DETAILED DESCRIPTION OF THE INVENTION

The present invention addresses the problems with the Varian 350 D implanter and any similar processing system that displays similar problems by checking for misalignment of wafers and including an interlock circuit that stops the platen from closing when a misalignment is detected. Referring again to FIG. 15, which shows the prior art platen faceplate 1502. Chuck vacuum channels 1508 are shown extending from the chuck orifice 1512. The channels 1508 serve to secure a wafer to the faceplate of the platen once the chuck has been retracted to bring the wafer flush with the faceplate 1502. Also, the channels 1508 serve, to some extent, to detect when a wafer is misaligned by monitoring a chuck vacuum drop (since the chuck orifice 1512 is in flow communication with the channels 1508). However, it will be appreciated that since the channels 1508 extend outwardly only up to a 100 mm diameter, a chuck vacuum drop will not be detected unless there is a misalignment of more than 50 mm. This amount of misalignment would cause wafer breakage when the platen closes on the vacuum chamber. Furthermore, the Varian endstation does not even check the chuck vacuum after the chuck retracts, thus rendering the vacuum channels 1508 useless for purposes of monitoring misalignment of wafers.

Figure 16:
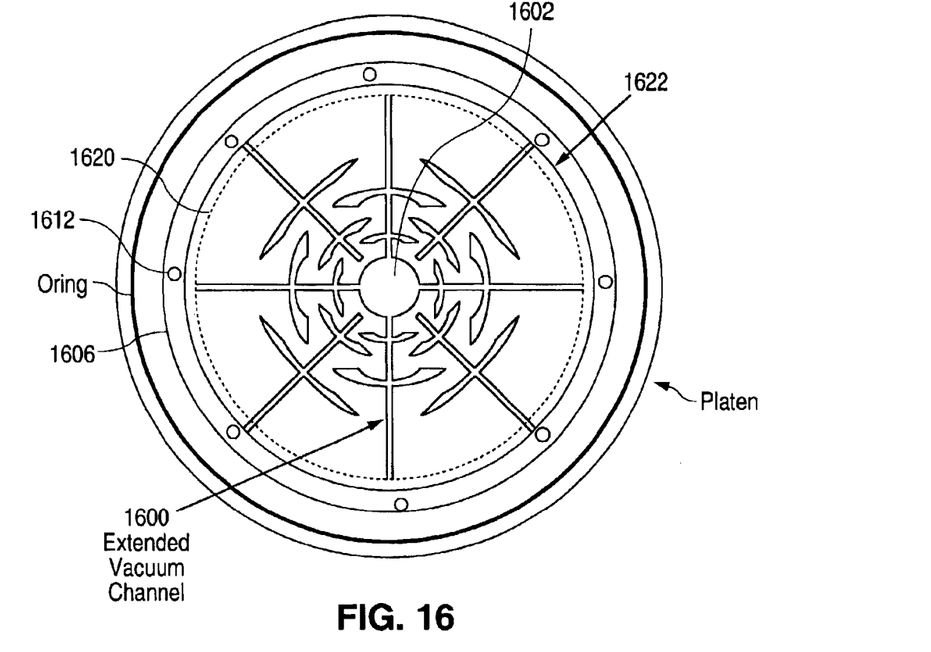
FIG. 16 is a front view of one embodiment of a platen as proposed by the invention.

The present invention proposes retrofitting the platen to provide for chuck vacuum channels that extend to a diameter that is not much smaller than the diameter of the wafer to be held by the platen faceplate. For instance, for a 150 mm diameter wafer, the chuck vacuum channels, in one embodiment, were made to extend from the chuck orifice outwardly to a diameter of 148 mm as shown in FIG. 16. In FIG. 16 the chuck vacuum channels 1600 are shown extending outwardly from a chuck orifice 1602 to a diameter of 148 mm to define a 148 mm detection diameter as indicated by doted line 1620. The platen faceplate 1606 in this case has an inner or smaller tier 1622 of diameter 152 mm. In the embodiment of FIG. 16, a 150 mm wafer that is misaligned by more than 2 mm will therefore allow air to leak into the vacuum channels 1600, thereby reducing the vacuum in the channels 1600 and also the chuck vacuum since the channels 1600 are in flow communication with the chuck orifice 1600. The rest of the platen1610 remains essentially unchanged. It includes peripheral holes 1612 for securing the faceplate 1606, and an O-ring 1614 (which was depicted by reference numeral 142 in FIG. 8).

By monitoring the drop in vacuum, i.e, by monitoring the drop in air pressure in the chuck orifice 1602 or channels 1600, a misalignment of as little as 2 mm can therefore be detected. This can be used by an interlock circuit such as the interlock circuit shown in FIG. 17.

Figure 17:
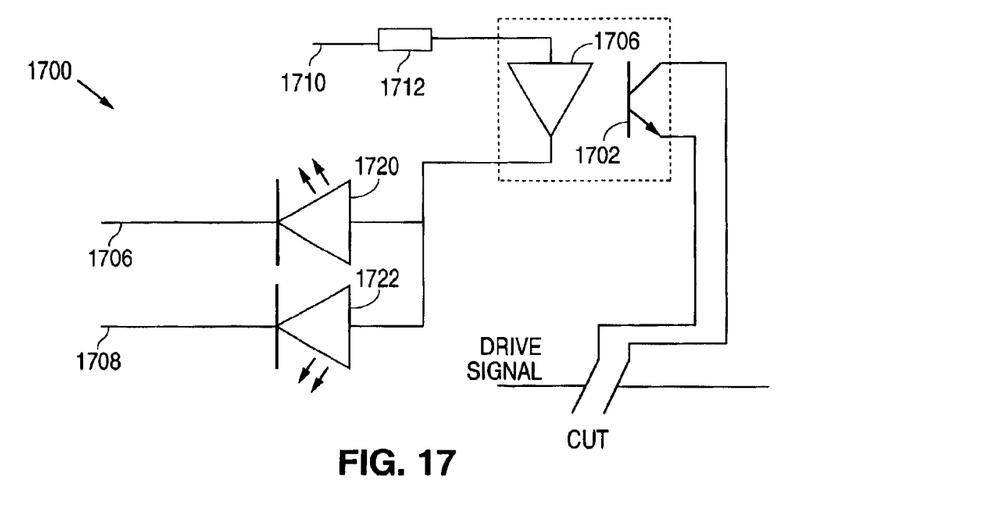
FIG. 17 is one embodiment of an interlock circuit of the invention.

The circuit 1700 includes an opto-isolator that includes a transistor 1702 and a light emitting diode (LED) 1704. The diode 1704 is connected to two inputs 1706, 1708, that sink current from a SV source 1710 through a resistor 1712. Input 1706 sinks current when the platen orient is in the home position. This occurs when processing is complete, the wafer is removed, and the platen wishes to close. Input 1708 sinks current when no wafer misalignment is detected due to a pressure drop in the chuck orifice of the platen. Since inputs 1706, 1708 are connected in parallel, current flows through the diode 1704 when either the platen orient is in the home position or when the wafer is correctly positioned on the platen. This turns on the transistor 1702 to close the drive signal circuit and allow the platen to close. When either of these conditions is not present, the transistor 1702 is turned off and the drive signal is not sent to the drive circuit. The inputs 1706, 1708 further include light emitting diodes 1720, 1722, respectively, to indicated when current is flowing to the particular input.

Figure 18:
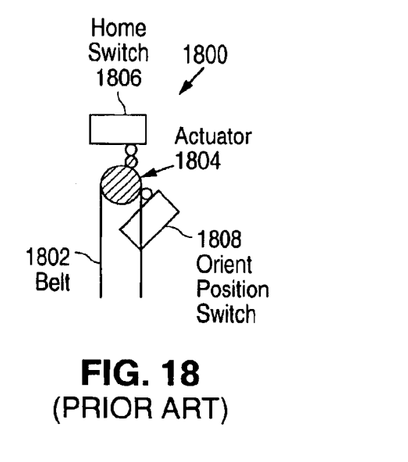
FIG. 18 is a depiction of a typical orientor switch assembly known in the art.

The input signals 1706, 1708 can best be understood with reference to FIG. 18, which shows a representation of an orient switch assembly 1800, which is also shown in FIG. 8. As shown in FIG. 8, the assembly 1800 is connected to the chuck 108 by means of a belt 1802. The assembly controls the rotational orientation of the wafer on the chuck 108, by having an actuator 1804 which engages either a home switch 1806 or a orient position switch 1808, to provide the input signals 1706, 1708, respectively. This ensures that the wafer flat 1402 (FIG. 14) is in the home position for loading and unloading of the wafer onto or from the platen, and is rotated to its preset angle prior to the chuck being retracted. The preset angle is process dependent and serves to avoid channeling by the ions when the wafer is subjected to the ion beam in the chamber.

While a specific embodiment has been described, it will be appreciated that the present invention is applicable to any wafer handlers that have similar chuck vacuum channel issues and an inability to properly monitor wafer alignment on the platen. The monitoring of the wafer position may even be performed using techniques other than monitoring air pressure in the vacuum channels. For instance, in another embodiment, light sensors were used to monitor the position of the wafer. Similarly, imaging techniques could be used to identify the position of the wafer, and have this relayed to an interlock circuit. Also, it will be appreciated that the circuit described in FIG. 17 is only one example of an interlock circuit and that other circuits could be substituted to take a misalignment signal and use it to stop the platen from closing.

What is claimed is:

1. A method of avoiding wafer breakages due to misalignment on a platen, comprising:
    monitoring wafer misalignments that are large enough to cause wafer breakages when the platen closes on a vacuum chamber, and
    providing an interlock circuit to stop the platen from closing in the event that such wafer misalignment is detected, wherein the monitoring includes providing a platen faceplate that has chuck vacuum channels that extend from a chuck orifice outwardly to a diameter that is only slightly smaller than the diameter of the wafer being handled, and monitoring the air pressure in the chuck vacuum channels.

2. A method of claim 1, wherein the diameter to which the channels extend is 1 to 4 mm less than the wafer diameter.

3. A method of claim 1, wherein the interlock circuit is connected to a platen close signal to interrupt the close signal when a wafer misalignment is detected.

4. A method of claim 3, wherein the interlock circuit overrides the interrupt when the platen orientor is in a home position.

5. A method of claim 1, wherein the interlock circuit overrides the interrupt when the platen orientor is in a home position.

6. A method of claim 1, wherein the interlock circuit incudes an opto-isolator to switch on a transistor of the opto-isolator to permit a platen close signal to be transmitted.

7. A method of claim 5, wherein the interlock circuit incudes an opto-isolator to switch on a transistor of the opto-isolator to permit a platen close signal to be transmitted.

8. A method of claim 7, wherein the opto-isolator includes two light emitting diodes, one being activated when no chuck vacuum drop is detected, and one being activated when the platen orientor is in its home position.

9. A wafer handling system for reducing wafer damage by ensuring that a platen of the system does not close unless the wafer is correctly aligned, the system comprising:
    a platen faceplate on which the wafer is held by means of vacuum channels in the faceplate that extend almost to the periphery of the wafer, and
    means for monitoring the air pressure in the channels and generating a stop signal if the air pressure is below a defined value.

10. A system of claim 9, wherein the means for monitoring and generating a stop signal includes an interlock circuit for preventing closing of the platen if a stop signal is generated.

11. A system of claim 10, wherein the means includes an override to allow the platen to close when a platen orientor is in a home position.

12. A system of claim 9, wherein the means for monitoring and generating a stop signal comprises one or more functional devices.

* * * * *